United States Patent
Barnes et al.

(10) Patent No.: US 8,026,115 B2
(45) Date of Patent: Sep. 27, 2011

(54) OPTICAL BONDING COMPOSITION FOR LED LIGHT SOURCE

(75) Inventors: Amy S. Barnes, St. Paul, MN (US); D. Scott Thompson, Woodbury, MN (US); Brant U. Kolb, Afton, MN (US); Todd A. Ballen, St. Paul, MN (US); Jacqueline C. Rolf, River Falls, WI (US); Robert L. Brott, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 233 days.

(21) Appl. No.: 12/514,630

(22) PCT Filed: Nov. 15, 2007

(86) PCT No.: PCT/US2007/084806
§ 371 (c)(1),
(2), (4) Date: May 13, 2009

(87) PCT Pub. No.: WO2008/064070
PCT Pub. Date: May 29, 2008

(65) Prior Publication Data
US 2010/0059776 A1    Mar. 11, 2010

Related U.S. Application Data

(60) Provisional application No. 60/866,280, filed on Nov. 17, 2006.

(51) Int. Cl.
*H01L 21/00* (2006.01)
*H01L 33/00* (2006.01)
*C09D 183/04* (2006.01)

(52) U.S. Cl. .......... 438/26; 438/29; 106/287.16; 257/98
(58) Field of Classification Search .......... 438/26, 438/29; 106/287.16
See application file for complete search history.

(56) References Cited

U.S. PATENT DOCUMENTS
5,777,433 A    7/1998  Lester et al.
(Continued)

FOREIGN PATENT DOCUMENTS
JP    2001-139894    5/2001
(Continued)

OTHER PUBLICATIONS

Chu et al., "Effects of Different n-Electrode Patterns on Optical Characteristics of Large-Area p-Side-Down InGaN Light-Emitting Diodes Fabricated by Laser Lift-Off," *Jpn. J. Appl. Phys.*, vol. 44, No. 11 (2005) pp. 7910-7912.

(Continued)

*Primary Examiner* — Randy Gulakowski
*Assistant Examiner* — Robert Loewe
(74) *Attorney, Agent, or Firm* — Elizabeth A. Gallo

(57) ABSTRACT

Disclosed herein is an optical bonding composition that may be used in optical applications. An LED light source that utilizes the composition is also disclosed, as well as a method of making it. The LED light source may comprise: an LED die; an optical element optically coupled to the LED die; and a bonding layer comprising surface-modified metal oxide nanoparticles in an amorphous silicate network, the bonding layer bonding the LED die and the optical element together. Efficiency of the LED light source may be increased when using an optical extractor as the optical element.

20 Claims, 2 Drawing Sheets

U.S. PATENT DOCUMENTS

| | | | |
|---|---|---|---|
| 5,872,170 | A | 2/1999 | Mine et al. |
| 6,039,831 | A | 3/2000 | Mine et al. |
| 6,129,854 | A | 10/2000 | Ramsey et al. |
| 6,258,618 | B1 | 7/2001 | Lester |
| 6,307,218 | B1 | 10/2001 | Steigerwald et al. |
| 6,340,824 | B1 | 1/2002 | Komoto et al. |
| 6,346,305 | B1 | 2/2002 | Ramsey et al. |
| 6,376,590 | B2 | 4/2002 | Kolb et al. |
| 6,428,896 | B1 | 8/2002 | Ramsey et al. |
| 6,548,176 | B1 | 4/2003 | Gwo |
| 6,679,621 | B2 | 1/2004 | West et al. |
| 6,791,120 | B2 | 9/2004 | Toda et al. |
| 6,803,719 | B1 * | 10/2004 | Miller et al. ............... 313/501 |
| 6,806,509 | B2 | 10/2004 | Yoshino et al. |
| 6,836,602 | B2 | 12/2004 | Filhaber et al. |
| 6,875,082 | B2 | 4/2005 | Nakayama et al. |
| 6,890,849 | B2 | 5/2005 | Kado et al. |
| 6,942,360 | B2 | 9/2005 | Chou et al. |
| 6,995,484 | B1 * | 2/2006 | Heimann et al. ............ 310/45 |
| 7,009,213 | B2 | 3/2006 | Camras et al. |
| 7,053,419 | B1 | 5/2006 | Camras et al. |
| 7,064,355 | B2 | 6/2006 | Camras et al. |
| 7,070,300 | B2 | 7/2006 | Harbers et al. |
| 7,078,735 | B2 | 7/2006 | Shono et al. |
| 7,118,438 | B2 | 10/2006 | Ouderkirk et al. |
| 7,166,865 | B2 | 1/2007 | Kurahashi et al. |
| 7,169,031 | B1 | 1/2007 | Fletcher et al. |
| 7,192,795 | B2 * | 3/2007 | Boardman et al. ............ 438/22 |
| 7,259,400 | B1 * | 8/2007 | Taskar ........................ 257/98 |
| 7,268,371 | B2 | 9/2007 | Krames et al. |
| 7,285,791 | B2 * | 10/2007 | Beeson et al. ............ 250/487.1 |
| 7,286,296 | B2 | 10/2007 | Chaves et al. |
| 7,304,425 | B2 | 12/2007 | Ouderkirk et al. |
| 7,329,982 | B2 | 2/2008 | Conner et al. |
| 7,330,319 | B2 | 2/2008 | Ouderkirk et al. |
| 7,404,756 | B2 | 7/2008 | Ouderkirk et al. |
| 7,423,297 | B2 | 9/2008 | Leatherdale et al. |
| 7,494,519 | B2 | 2/2009 | Fletcher et al. |
| 7,525,126 | B2 | 4/2009 | Leatherdale et al. |
| 7,573,073 | B2 | 8/2009 | Leatherdale et al. |
| 2002/0030194 | A1 * | 3/2002 | Camras et al. ............... 257/98 |
| 2004/0256706 | A1 * | 12/2004 | Nakashima ................ 257/678 |
| 2004/0265599 | A1 * | 12/2004 | Ushio et al. ................ 428/447 |
| 2005/0093430 | A1 * | 5/2005 | Ibbetson et al. ............. 313/501 |
| 2005/0269578 | A1 | 12/2005 | Barnes et al. |
| 2006/0011935 | A1 * | 1/2006 | Krames et al. ............... 257/99 |
| 2006/0012299 | A1 * | 1/2006 | Suehiro et al. ............. 313/512 |
| 2006/0043399 | A1 | 3/2006 | Miyagaki |
| 2006/0046328 | A1 | 3/2006 | Raffetto et al. |
| 2006/0091411 | A1 | 5/2006 | Ouderkirk et al. |
| 2006/0091412 | A1 | 5/2006 | Wheatley et al. |
| 2006/0105480 | A1 * | 5/2006 | Boardman et al. ............ 438/22 |
| 2006/0186428 | A1 * | 8/2006 | Tan et al. ................... 257/100 |
| 2006/0226429 | A1 | 10/2006 | Sigalas |
| 2006/0291226 | A1 * | 12/2006 | Daicho et al. ............... 362/509 |
| 2007/0093181 | A1 | 4/2007 | Lugg et al. |
| 2007/0257270 | A1 | 11/2007 | Lu et al. |

FOREIGN PATENT DOCUMENTS

| | | |
|---|---|---|
| KR | 2002-0035819 | 5/2002 |
| KR | 10-2005-0061909 | 6/2005 |
| KR | 10-2005-0090928 | 9/2005 |
| WO | WO 97/43117 | 11/1997 |
| WO | WO 2004/077580 | 9/2004 |

OTHER PUBLICATIONS

Itoh et al., "Straight and Smooth Etching of GaN (1100) Plane by Combination of Reactive Ion Etching and KOH Wet Etching Techniques," *Jpn. J. Appl. Phys.*, vol. 45, No. 5A (2006) pp. 3988-3991.

Kim, "GaN-Based Light-Emitting Diode with Indium-Tin-Oxide and Vertical Electrode," *Jpn. J. Appl. Phys.*, vol. 44, No. 8 (2005) pp. 5994-5999.

Koh et al., "Study of Semiconductor Film Bonding Technology on Piezoelectric Substrate Using Water Glass," *Jpn. J. Appl. Phys.*, vol. 42 (2003) pp. 5613-5618.

Song et al., "Formation of low resistance and transparent ohmic contacts to p-type GaN using Ni-Mg solid solution," *Applied Physics Letters*, vol. 83, No. 17 (2003) pp. 3513-3515.

* cited by examiner

OPTICAL BONDING COMPOSITION FOR LED LIGHT SOURCE

CROSS REFERENCE TO RELATED APPLICATIONS

This application is a national stage filing under 35 U.S.C. 371 of PCT/US2007/084806, filed Nov. 15, 2007, which claims priority to U.S. Application No. 60/866,280, filed Nov. 17, 2006, the disclosure of which is incorporated by reference in its/their entirety herein.

FIELD OF THE INVENTION

The invention relates to LED light sources, and particularly, to an LED light source having an optical element bonded to an LED die using an optical bonding composition.

BACKGROUND

LED light sources have the inherent potential to provide the brightness, output, and operational lifetime of conventional light sources. Unfortunately, an LED light source produces light in a semiconductor material, often referred to as an LED die, and it can be difficult to extract light efficiently from the LED die without substantially reducing brightness or increasing the apparent emitting area of the LED light source. This difficulty is often due to the large refractive index mismatch between the LED die (refractive index, n, 2.4 or greater) and air (n=1) such that much of the light generated in the LED die is totally internally reflected and cannot escape the die thus reducing brightness.

Previous approaches for extracting light from LED dies include the use of encapsulants which encapsulate the LED die. Encapsulants typically have a higher refractive index than air (n~1.5 for typical epoxy encapsulants) such that the refractive index mismatch at the interface of the die with its surroundings is reduced. As a result, less light is wasted and the light source is brighter. There is, however, need for further improvement in efficiency and brightness. In addition, encapsulants are susceptible to large temperature shifts from heat generated at the LED die which causes stress that can damage the die over many temperature cycles. Encapsulants can also yellow and otherwise degrade over time.

Extractors may also be used to extract light from LED dies. These optical elements are typically transparent polymers or glasses and are disposed in contact with or in close proximity to the surface of the LED die. The extractor and LED die are optically coupled such that light is extracted from the LED die. Extractors typically have an input surface sized and shaped to substantially mate with a major emitting surface of the LED die. The use of extractors, however, has been hampered by the difficulty with bonding the extractor and the LED die. Known bonding methods require elevated temperatures (greater than 350° C.) and pressures, both of which may negatively affect the functionality of the LED light source. Known bonding methods also require involved manufacturing processes, such as chemical vapor deposition, various forms of epitaxy, etc., which limits the usefulness of these methods to select applications.

SUMMARY

Disclosed herein is an optical bonding composition and an LED light source comprising the composition. The LED light source may comprise: an LED die; an optical element optically coupled to the LED die; and a bonding layer comprising surface-modified metal oxide nanoparticles in an amorphous silicate network, the bonding layer bonding the LED die and the optical element together. The amorphous silicate network may be derived from silicate, silane, silicic acid, polymeric forms of silicic acid, alkoxysilane, or combinations thereof. The surface-modified metal oxide nanoparticles comprise metal oxide nanoparticles and a surface-modifier. Useful metal oxide nanoparticles include zirconium oxide, titanium oxide, zinc oxide, tantalum oxide, niobium oxide, lanthanum oxide, strontium oxide, yttrium oxide, hafnium oxide, tin oxide, antimony oxide, and combinations thereof. Mixed oxides of the aforementioned may also be used. In one particular example, the metal oxide nanoparticles comprise crystalline zirconium oxide nanoparticles having a refractive index of greater than about 1.8. Useful surface-modifiers include carboxylic acids, phosphonic acids, alkoxysilanes, or a combination or mixture thereof. The optical element is typically an optical extractor that increases efficiency of the light source by facilitating escape of light from inside the LED die.

Also disclosed herein is a method of making an LED light source, the method comprising: a) providing an LED die; b) providing an optical element; c) providing a optical bonding composition comprising surface-modified metal oxide nanoparticles and a source of silicon in an aqueous solution having a pH greater than about 8, the source of silicon selected from the group consisting of silicate, silane, silicic acid, polymeric forms of silicic acid, alkoxysilane, and combinations thereof; and d) bonding the LED die and the optical element together by contacting the LED die and the optical element with the optical bonding composition.

The LED light source disclosed herein may be useful in a variety of lighting applications such as for backlighting signs and liquid crystal displays that may be either edge-lit or direct-lit. The LED light source disclosed herein may also be used as a light source for LED signage, automotive applications, projection applications, and general illumination including architectural, mood, and artistic lighting.

These and other aspects of the invention will be apparent from the detailed description below. In no event, however, should the above summary be construed as a limitation on the claimed subject matter, which subject matter is defined solely by the attached claims, as may be amended during prosecution.

BRIEF DESCRIPTIONS OF DRAWINGS

The invention may be more completely understood in consideration of the following detailed description and examples in connection with the figures described below. The figures, in no event, should be construed as limitations on the claimed subject matter, which subject matter is defined solely by the claims as set forth herein.

DETAILED DESCRIPTION

Figure 1:
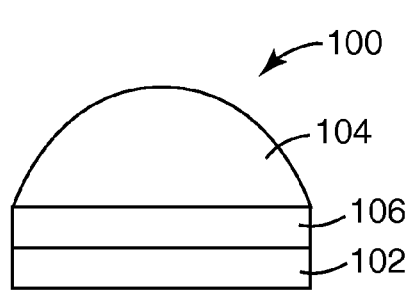
FIG. 1 shows a schematic cross section of an exemplary LED light source.

FIG. 1 shows a schematic cross section of exemplary LED light source 100 comprising LED die 102 and optical element 104 that are bonded together by bonding layer 106. The bonding layer comprises surface-modified metal oxide nanoparticles in an amorphous silicate network. In general, the LED die and the optical element are optically coupled such that light emitted by the LED die is able to propagate and reach the optical element. The optical element may be an extractor into which light can enter and exit in a variety of ways depending on the particular nature of the element.

For simplicity, the LED die is shown generically in FIG. 1 but can include conventional design features known in the art. For example, the LED die can include distinct p- and n-type semiconductor layers typically formed from III-V semiconductors including nitrides such as AlN, GaN, InN; phosphides such as InGaP, AlP, GaP, InP; and others such as AlAs, GaAs, InAs, AlSb, GaSb, and InSb. The LED die may also be formed from a II-VI semiconductor such as ZnS, ZnSe, CdSe, and CdTe; Group IV semiconductors Ge, Si and carbides such as SiC. The LED die may also comprise buffer layers, substrate layers, and superstrate layers. The refractive index of an LED die ranges from about 1.7 to about 4.1 at the typical emission wavelength of the light source in which it is present.

Although a rectangular LED die is shown, other known configurations are also contemplated, such as an LED die with angled side surfaces that form a truncated inverted pyramid. Electrical contacts to the LED die are not shown for simplicity but can be provided on any one or more surfaces for application of power to energize the device. Examples include solder reflow, wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations.

The optical elements disclosed herein are made of solid, transparent materials having a relatively high refractive index. Suitable materials for optical elements include inorganic materials such as optical glasses, e.g. Schott glass type LASF35 or N-LAF34, available from Schott North America, Inc., and those described in U.S. Ser. No. 11/381,518 (Leatherdale et al.), the disclosure of which is incorporated herein by reference. Other suitable inorganic materials include ceramics, e.g. sapphire, zinc oxide, zirconium oxide, diamond, and silicon carbide. Sapphire, zinc oxide, diamond, and silicon carbide are particularly useful since these materials also have a relatively high thermal conductivity (0.2-5.0 W/cm K). The optical element may also comprise thermoset high index polymers such as acrylics, epoxies, silicones, polycarbonates and polycyclics, or thermoplastic high index polymers such as polycarbonates and cyclic olefins. The optical element may comprise a thermoset or thermoplastic polymer in combination with ceramic nanoparticles including zirconium oxide, zinc oxide, titanium oxide, and zinc sulfide.

The refractive index of the extractor may be at least about 1.5, for example, greater than about 1.8, or greater than about 2, at the emission wavelength of the LED die. In one example, the refractive index of the optical element may be the same as, nearly the same as, or no greater than that of the light emitting surface of the LED die. This would allow for maximum extraction of the light. For example, the refractive indices may be within about 0.2. Alternatively, the refractive index of the extractor may be greater than or less than that of the light emitting surface of the LED die. For example, if the light emitting surface of the LED die is 1.75, then the extractor may have a refractive index of 1.7, 1.75, 1.9, 2.1, or 2.3.

In one example, the optical element comprises an optical glass having a refractive index of at least about 1.7. In another example, the optical element comprises a glass or glass-ceramic material having a refractive index of at least about 2.0, preferably at least 2.1, 2.2, or 2.3 or more, as described in U.S. Ser. No. 11/381,518 (Leatherdale et al.). In general, these materials comprise less than 20% by weight $B_2O_3$, less than 20% by weight $SiO_2$, and less than 40% by weight $P_2O_5$. In some cases, the following materials are limited to less than 20% by weight: $As_2O_3$, $Bi_2O_3$, $GeO_2$, NaO, $TeO_2$, $V_2O_5$, $SiO_2$, $B_2O_3$, and $P_2O_5$. Useful glasses or glass-ceramic materials comprise at least two metal oxides such as $Al_2O_3$; $TiO_2$; rare earth oxides; or alkaline earth metal oxides. The crystallization temperature $T_x$ of these materials is preferably at least 5° C. above their glass transition temperature $T_g$, which facilitates molding of the material into an optical element.

One example of an optical element is an extractor which can be used to extract light out of the LED die. In general, the extractor modifies the angular distribution of light, turning a first light emission pattern into a second, different light emission pattern. Depending on the shape of the extractor, the pattern of the emitted light is in a generally forward direction and may be circular around the extractor, or to the sides in some symmetrical or asymmetrical distribution.

The optical element may comprise a converging extractor as described in U.S. Ser. No. 11/381,324 (Leatherdale et al.), the disclosure of which is incorporated herein by reference. Converging extractors have at least one converging side, a base, and an apex, the apex disposed at least partially over the base and having a surface area smaller than that of the base, and the at least one converging side converging from the base towards the apex. The shape of the converging extractor can be pyramidal, polyhedral, wedge-like, cone-like, etc., or some combination thereof. The base can have any shape, e.g., square, circular, symmetrical, non-symmetrical, regular, or irregular. The apex may be a point, a line, or a flat or rounded surface, and it resides over the base either centered or skewed away from the center of the base. For a converging extractor, the base is typically disposed adjacent and generally parallel to the LED die. Also, the base and the LED die may be substantially matched in size, or the base can be smaller or larger than the LED die.

Figure 2A:
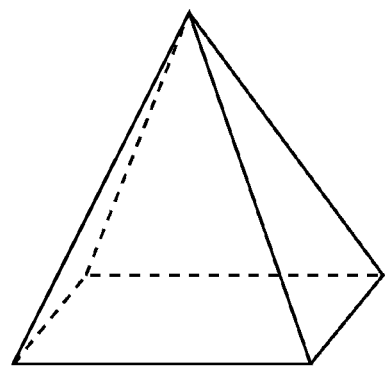
FIGS. 2a-2d show exemplary converging extractors.
Figure 2B:
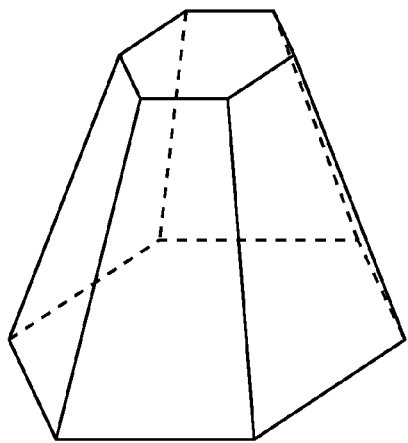
Figure 2C:
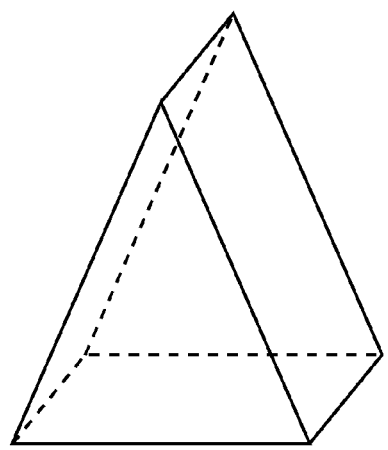
Figure 2D:
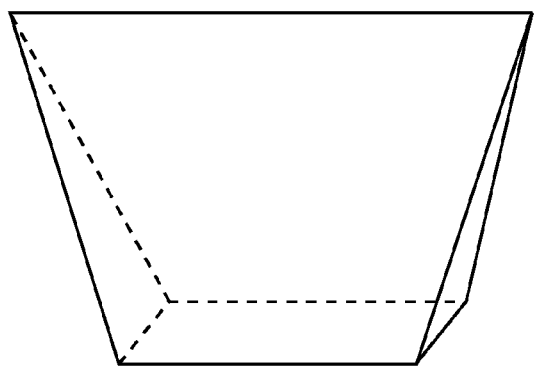

FIGS. 2a-2d show perspective views of exemplary converging extractors: FIG. 2a shows a four-sided pyramid; FIG. 2b shows a six-sided polygon; and FIGS. 2c and 2d show wedges wherein the apex (a line) is disposed above the base, the apex centered and skewed away from the center, respectfully. The extractor shown in FIG. 2d also has two diverging sides which act to collimate the light and the converging sides allow the light to be redirected to the sides. Other examples of converging extractors are shown in U.S. application Ser. No. 11/381,324 (Leatherdale et al.).

Figure 3A:
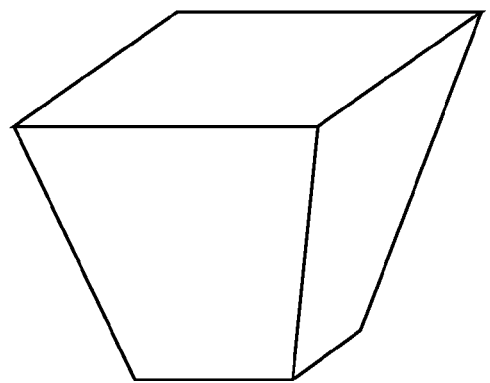
FIGS. 3a-3c and 4a-4b show exemplary diverging extractors.
Figure 3B:
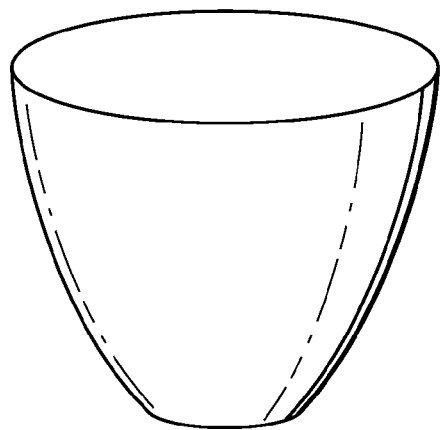
Figure 3C:
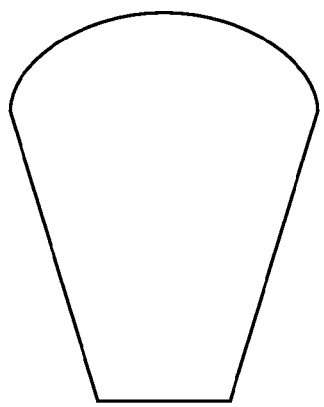

The optical element may comprise a diverging extractor as described in US Appl. Nos. 2006/0091784 A1 (Connor et al.), 2006/0091411 A1 (Ouderkirk et al.), 2006/0091798 A1 (Ouderkirk et al.), and 2006/0092532 A1 (Ouderkirk et al.), the disclosures of which are incorporated herein by reference. A diverging extractor has at least one diverging side, an input surface, and an output surface that is larger than an input surface. Diverging extractors are generally shaped in the form of a taper. FIGS. 3a-3c show exemplary diverging extractors: FIG. 3a shows a perspective view of a truncated inverted polygon having four sides; FIG. 3b shows a perspective view of a truncated inverted taper having parabolic sidewalls; and FIG. 3c shows a schematic cross section of a truncated inverted cone having a convex output surface.

Figure 4A:
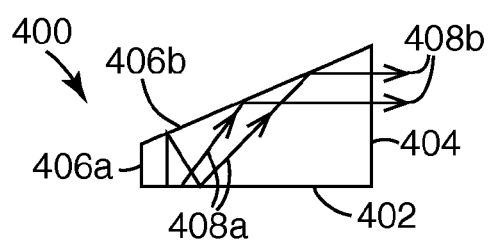
Figure 4B:
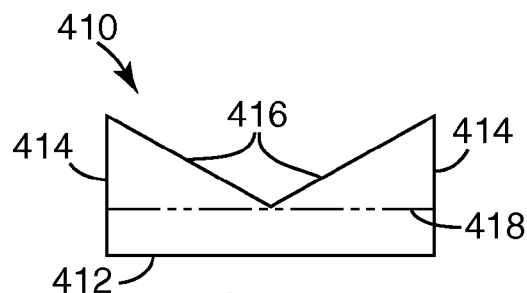

Examples of diverging extractors are also shown in FIGS. 4a and 4b previously described in U.S. Ser. No. 11/381,518 (Leatherdale et al.). The surfaces of these extractors are arranged to redirect light from the LED die in a predominately sideways direction, rather than in a forward direction along a central axis of the LED die. Side-emitting LEDs are particularly suited for use in thin direct-lit backlights for liquid crystal display panels, since the light can be made to spread out laterally over a short distance, avoiding bright and dark areas or hot spots across the viewing area of the display.

FIG. 4a is a schematic side view of a wedge-shaped extractor 400. Extractor 400 has an input surface 402, an output surface 404, and side surfaces 406a and 406b. The input and output surfaces may be disposed at a substantial angle to each other, nominally about 90 degrees. With this arrangement, light rays 408a entering through the input surface reflect off of one or both of the side surfaces (whether by total internal reflection or with the aid of a reflective material or coating, not shown) and are redirected approximately sideways as represented by light rays 408b. Light rays 408b subsequently exit through the output surface. The shape or perimeter of extractor 400 from a top view may take any of a variety of forms including rectangular, trapezoidal, pie-shaped, semi-circular or any combination thereof.

FIG. 4b is a schematic side view of another wedge-shaped extractor 410. Extractor 410 has an input surface 412, an output surface 414, and side surfaces 416. The extractor 410 can have the shape of extractor 400 rotated about a vertical axis coincident with side surface 406a. In some cases, the extractor can be made by joining two of the extractors 400 at their respective side surfaces 406a in a compound construction. In a different compound construction, phantom line 418 represents a possible interface or boundary between distinct optical bodies making up the extractor 410.

Similar to extractor 400, the input and output surfaces of extractor 410 are disposed at a substantial angle to each other, nominally about 90 degrees. Light from the LED entering through the input surface reflect off of one or both side surfaces (whether by total internal reflection or with the aid of a reflective material or coating, not shown) and are redirected approximately sideways, subsequently exiting through the output surface. From a top view (not shown), extractor 410 can have any of a number of shapes including, for example, polygonal (e.g. square or rectangular), circular, and elliptical. With circular and elliptical shapes or perimeters, light entering through the input surface is redirected to form a ring of output light.

As for converging extractors, the input surface of a diverging extractor is typically disposed closest and generally parallel to the LED die. Also, the input surface and the LED die may be substantially matched in size, or the input surface can be smaller or larger than the LED die. Other examples of diverging extractors are described in U.S. Pat. No. 7,009,213 B2 and U.S. Pat. No. 6,679,621 B2.

As described above, the LED die comprises alternating semiconductor layers. One of the outermost layers may be referred to as a light emitting layer, and this layer has an outermost surface that may be referred to as a light emitting surface. Also as described above, the optical element comprises a light input surface. In one useful configuration, the LED light source comprises the LED die and the optical element bonded together such that the light emitting surface and the light input surface are in contact with the bonding layer as shown, for example, in FIG. 1.

An optical bonding composition is used to form the bonding layer. The optical bonding composition comprises surface-modified metal oxide nanoparticles; and a source of silicon in an aqueous solution having a pH greater than about 8. The source of silicon may comprise silicate, silane, silicic acid, polymeric forms of silicic acid, alkoxysilane, or combinations thereof. Silica dissolved in water may be used to form silicic acid, Si(OH)$_4$, which occurs upon hydration of the silica. By keeping the pH greater than about 8, polymerization condensation is catalyzed by hydroxide ions, forming polymeric forms of silicic acid. Silicate may be formed by increasing the pH, for example, to greater than about 8, or to greater than about 11.

The optical bonding composition may comprise one or more alkoxysilanes having the formula:

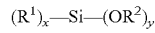

wherein $R^1$ may be an alkyl, alcohol, polyglycol, or polyether group, or a combination or mixture thereof; $R^2$ may be an alkyl, acetoxy, or a methoxyethoxy group, or a mixture thereof x=from 0 to 3; y=from 1 to 4, with the proviso that x+y=4. The one or more alkoxysilanes may be added to lower the crosslink density and add flexibility to the silicate network.

The optical bonding composition may comprise one or more silanes having the formula:

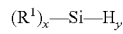

wherein $R^1$ may be an alkyl, alcohol, polyglycol, or polyether group, or a combination or mixture thereof x=from 1 to 3; y=from 1 to 3, with the proviso that x+y=4.

A variety of materials may be used to adjust the pH of the optical bonding composition. Examples include strong bases such as sodium hydroxide, potassium hydroxide, calcium hydroxide, strontium hydroxide, ammonium hydroxide, and sodium ethoxide. Weak bases such as sodium polymetaphosphate may also be used if it is desirable to slow down the hydroxide catalysis.

A bonding layer between the LED die and the optical element is formed when the LED die and the optical element are bonded together. It is believed that the optical bonding composition undergoes reaction to form a silicate network. The reaction may be accelerated by application of heat. A silicate network refers to a chemically bonded network similar to, but looser than, the bulk structure of silica. The three-dimensional structure of silica is based on siloxane bridges (Si—O—Si) with each silicon atom bonded to four oxygen atoms in a tetrahedral geometry. Like silica, a silicate network comprises siloxane bridges, however, the silicate network also comprises embedded and/or exposed non-bridging oxygens as local terminating groups within the network. The non-bridging oxygens are present in the form of silanol groups (Si—OH) or in a more anionic form with a cation, typically a metal cation (Si—O$^-$M$^+$). Further discussion of silicate networks may be found, for example, in *The Chemistry of Silica* by R. K. Iler (Wiley, New York 1979).

The optical composition also comprises surface-modified metal oxide nanoparticles. The surface-modified metal oxide nanoparticles may comprise metal oxide nanoparticles selected from the group consisting of zirconium oxide, titanium oxide, zinc oxide, tantalum oxide, niobium oxide, lanthanum oxide, strontium oxide, yttrium oxide, hafnium oxide, tin oxide, antimony oxide, and combinations thereof. The metal oxide nanoparticles may also comprise mixed metal oxide nanoparticles of at least two metal oxides selected from the group consisting of silicon oxide, aluminum oxide, zirconium oxide, titanium oxide, zinc oxide, tantalum oxide, niobium oxide, lanthanum oxide, strontium oxide, yttrium oxide, and combinations thereof. Titanium oxide nanoparticles may be of the rutile or anatase form. Particular examples of mixed metal oxide nanoparticles include those comprising silicon oxide and zirconium oxide; silicon oxide and titanium oxide; and silicon oxide, zirconium oxide, and titanium oxide. The particular metal oxide nanoparticles used may depend on a variety of factors such as refractive index, compatibility in the optical composition, cost, etc.

The metal oxide nanoparticles are surface-modified with one or more surface modifiers in order to increase compatibility of the metal oxide nanoparticles with other components in the bonding layer and/or the optical composition. For example, zirconium oxide nanoparticles are stable in aqueous acidic environments having a pH of from 2 to 4, and surface-modification could be used to protect against flocculation of the nanoparticles in the aqueous basic environment of the optical composition. Surface modification involves reacting the metal oxide nanoparticles with the surface modifier(s) which attach to the surface of the nanoparticles and which modify the surface characteristics thereof.

Surface modifiers may be represented by the formula A-B where the A group is capable of attaching to the surface of the metal oxide nanoparticle, and the B group is a compatibilizing group. In general, the A group needs to be selected by considering the particular metal oxide and the nature of the optical composition, i.e., the surface-modified metal oxide nanoparticles should be stable such that compatibility is maintained in the highly basic environment. Useful A groups include carboxylic acids, phosphonic acids, alkoxysilanes, amines, and combinations and mixtures thereof. Alkoxysilanes may be represented by the formula:

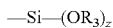

wherein $R_3$ is an alkyl group, an acetoxy group, a methoxyethoxy group, or mixtures thereof; and z=from 1 to 3.

Useful B groups are hydrophilic groups that render the metal oxide nanoparticles compatible in the optical composition; examples include alcohols, polyglycols, and polyethers. Examples of surface modifiers include polyethylene alkoxysilanes and polyethylene-like carboxylic acid derivatives such as 2[-2-(2-methoxyethoxy)ethoxy]acetic acid and (2-methoxyethoxy)acetic acid.

The surface-modified metal oxide nanoparticles have an average particle size that is smaller than the wavelength of light, for example, less than about 300 nm.

The surface-modified metal oxide nanoparticles may be present in the optical composition at an amount greater than one-half the source of silicon on a weight basis. With respect to the bonding layer that forms from bonding the LED die and the optical element together, the surface-modified metal oxide nanoparticles may be present in an amount of from about 1 to about 95% by weight relative to the weight of the bonding layer. Typically, it is desirable to have from about 40 to about 95% by weight of the surface-modified metal oxide nanoparticles relative to the total weight of the bonding layer. The particular amount used is partly determined by the desired refractive index for the bonding layer as described below. If the amount of the nanoparticles in the bonding layer is too great, however, it is difficult to obtain suitable bonding between the LED die and the optical element, and in addition, efficiency of the LED light source may suffer.

In particular, the surface-modified metal oxide nanoparticles comprise highly crystalline zirconia nanoparticles having a refractive index of at least about 1.8, preferably at least about 2.0, such as the nanoparticles described in U.S. Pat. No. 6,376,590 B2, the disclosure of which is incorporated herein by reference. The highly crystalline zirconium oxide nanoparticles may be incorporated into the optical composition by surface modification with one or more of the alkoxysilanes described above for the formula A-B. The highly crystalline zirconium oxide nanoparticles have an average particle size of less than about 100 nm.

The refractive index of the zirconia nanoparticles described above is much higher than that of amorphous zirconia. When incorporated into the silicate network to give an amorphous silicate network, the zirconia nanoparticles provide an increase in the refractive index of the bonding layer. Thus, the optical properties of the bonding layer may be tailored as described below, depending on the particular LED die and optical element to be bonded. In particular, the refractive index of the silicate network is about 1.4, and for the surface-modified zirconium oxide nanoparticles is from about 1.8 to about 2.1. The surface-modified metal oxide nanoparticles may also comprise crystalline titanium oxide nanoparticles having a refractive index of greater than about 2.0, and preferably greater than about 2.2.

The efficiency of the LED light source is directly related to the extent to which the LED die and the optical element are optically coupled. It should be noted that throughout the disclosure, reference to the refractive index of the LED die is a reference to the refractive index of a light emission layer of the LED die. The extent to which the LED die and the optical element are optically coupled depends on several factors including the thickness of the bonding layer and the refractive indices of the bonding layer, the LED die, and the optical element. In general, the refractive index of the bonding layer is less critical to optical coupling between the LED die and the optical element when the thickness of the bonding layer is substantially less than the wavelength of the emission light in air, for example, less than about 50 nm. As thickness increases, the refractive index of the bonding layer becomes increasingly critical with respect to optical coupling.

The bonding layer may have a thickness of less than 50 nm, but it is usually greater than about 50 nm, for example, up to about 200 nm or 300 nm, or even up to 10 um or 100 um. The bonding layer may have a thickness of from about 5 nm to about 300 nm, or from greater than about 50 nm to about 100 um. To optimize optical coupling between the LED die and the optical element, the thickness of the bonding layer is desirably substantially uniform over the area of contact between the first and second surfaces. The minimum necessary thickness of the bonding layer may depend on the flatness or irregularities of the surfaces to be bonded.

In order to maximize efficiency, the refractive index of the bonding layer is closely matched to that of the light emission surface of the LED die (or light emission layer as described above), for example, within about 0.2. If the refractive index of the bonding layer is too low, light emitted by the LED die becomes trapped in the die and is lost to absorption even if the bonding layer itself is nonabsorbing. By increasing the refractive index of the bonding layer to that of the light emission layer, a larger fraction of light emitted by the LED may be coupled out of the die and into the optical element, even if the bonding layer absorbs a portion of the emitted light.

As described above, the refractive index of the LED die, or light emission layer, ranges from about 1.7 to about 4.1 at the emission wavelength of the LED die. The refractive index of the amorphous silicate network without the surface-modified metal oxide nanoparticles is greater than about 1.4. The surface-modified metal oxide nanoparticles are used to increase the refractive index up to about 2.4. In one example, the refractive index of the bonding layer is at least about 1.5, for example, greater than about 1.8, or greater than about 2, at the emission wavelength of the LED die.

In a particular example, the LED die comprises a light emitting layer having a refractive index of greater than 1.9, and the bonding layer has a thickness of from about 50 nm to about 100 um. In another example, the LED die comprises a light emitting layer having a refractive index of less than or equal to 1.9, and the bonding layer has a thickness of from greater than about 5 nm to about 300 nm.

The bonding layer is substantially transparent to the particular wavelength of light emitted by the LED die. In most cases, at least about 70% transmission is desirable and may be obtained by optimization of transmission path length (bonding layer thickness) and absorption constant.

Also disclosed herein is a method of making an LED light source, the method comprising: a) providing an LED die; b) providing an optical element; c) providing a optical bonding composition comprising surface-modified metal oxide nanoparticles and a source of silicon in an aqueous solution having a pH greater than about 8, the source of silicon selected from the group consisting of silicate, silane, silicic acid, polymeric forms of silicic acid, alkoxysilane, and combinations thereof; and d) bonding the LED die and the optical element together by contacting the LED die and the optical element with the optical bonding composition.

The optical composition may be applied to one or more surfaces of either the LED die, the optical element, or both, using a pipette, or by dip coating, spin coating, aerosol dispensing, pouring, dispersing, spraying under water, or by joining the surfaces in a bath of the optical composition, or by other similar methods. The surfaces are then brought into contact to sandwich the optical composition such that the composition spreads across each of the surfaces and forms a homogenous layer. If bubbles form, they may be removed by application of a vacuum. The assembly is then allowed to stand at room temperature until it is handleable without bond failure; this may be from several minutes to several days. An external compressive force or vacuum may be used to accelerate the bonding process and/or to promote good bonding.

Heat may be applied to accelerate formation of and/or strengthen the bonding layer, however, the temperature of the assembly must remain below the lowest glass transition temperature of any of the components. Temperatures less than about 300° C. are typically used, for example, less than about 200° C., or less than or equal to 150° C. It is desirable that the lowest possible temperature be used in order to minimize residual stress and birefringence at the interface caused by the difference in the coefficient of thermal expansion of the LED die and the optical element. In some cases, care must be taken such that the temperature of the bonding layer does not exceed the temperature that would be reached during operation of the light source.

EXAMPLES

Example

Surface-modified zirconia nanoparticles were prepared by mixing a zirconia sol with a polyethylene glycol trialkoxysilane (Silquest® A-1230 from GE Advanced Materials) in a ratio that provides 1.2 mmol of silane per gram of zirconia. The mixture was heated to 80° C. for 4 hours and cooled to room temperature. The resulting sol was then added to a 40% by weight solution of sodium silicate (Titristar® SX-0755-6 from EMD Chemicals Inc.) to produce a ratio of sodium silicate:zirconia of 0.4:1.

The solution above was spun onto primed PET and dried at 150° C. for 1 hour. The refractive index of the resulting film was measured to be 1.7 using a Metricon prism coupler model 2010 from Metricon Corp. A film of the sodium silicate solution without the addition of zirconia nanoparticles was also spun onto primed PET and dried at 150° C. for 1 hour. The average refractive index of this film without zirconia nanoparticles was measured to be 1.5, again using a Metricon.

The solution of surface modified zirconia nanoparticles in sodium silicate described above was used to bond S-LAH-66 from O'Hara Corporation to polished sapphire (Rubicon Technology). The glass and sapphire were cleaned by sonication in acetone followed by isopropanol. The plates were dried with $N_2$ and organic residue was removed using a 10 minute exposure to a uv/ozone cleaning system. The plate of S-LAH-66 was placed on a photoresist spinner and 1 drop of the zirconia/sodium silicate solution was placed in the center of the glass plate. The plate was spun at 400 rpm for 30 seconds. A clean, polished piece of sapphire was brought into contact with the S-LAH-66 glass surface. A moderate pressure was applied for 30 seconds. The joined sample was allowed to sit at room temperature for 1 hour. The joined sample was then heated at 1° C./min to 150° C. and held for 1 hour, followed by cooling at 2° C./min.

The joining experiment described above was repeated using a water glass solution without the addition of surface modified zirconia nanoparticles. The concentration of sodium silicate in solution was kept the same as in the previous example by dilution in DI water (6% by weight sodium silicate). Again, a film was spun onto a cleaned plate of S-LAH-66 glass. A polished plate of sapphire was placed on top of the glass and moderate pressure was applied for 30 seconds. The joined sample was again allowed to sit at room temperature for 1 hour followed by a heat treatment at 150° C. for 1 hour (heating at 1° C./min).

After cooling to room temperature, the bond strength of both the sample with surface modified zirconia and the sample with only sodium silicate was high enough to allow for handling without fracture the newly formed bond between the glass and the sapphire.

Comparative Example

Zirconia Sol Mixed with Sodium Silicate without the Surface Modification

The sodium silicate solution was added to the zirconia sol without first surface modifying the zirconia in the PEG-silane. The ratio of silicate to $ZrO_2$ was again set at 0.4:1. The zirconia particles immediately fell out of solution, forming large white clumps in the solution.

Various modifications and alterations of the invention will become apparent to those skilled in the art without departing from the spirit and scope of the invention. It should be understood that the invention is not intended to be unduly limited by the illustrative embodiments and examples set forth herein, and that such examples and embodiments are presented by way of example only with the scope of the invention intended to be limited only by the claims set forth herein as follows.

What is claimed is:
1. An LED light source comprising:
an LED die;
an optical element optically coupled to the LED die; and
a bonding layer comprising surface-modified metal oxide nanoparticles in an amorphous silicate network, the bonding layer bonding the LED die and the optical element together;
wherein the surface-modified nanoparticles are selected from the group consisting of silicon oxide, aluminum oxide, zirconium oxide, titanium oxide, zinc oxide, tantalum oxide, niobium oxide, lanthanum oxide, strontium oxide, yttrium oxide, hafnium oxide, tin oxide, antimony oxide, and combinations thereof;
and wherein the optical element comprises an optical glass having a refractive index of at least about 1.7.

2. The LED light source of claim 1, the amorphous silicate network derived from silicate, silane, silicic acid, polymeric forms of silicic acid, alkoxysilane, or combinations thereof.

3. The LED light source of claim 1, the surface-modified metal oxide nanoparticles comprising mixed metal oxide nanoparticles of at least two metal oxides selected from the group consisting of silicon oxide, aluminum oxide, zirconium oxide, titanium oxide, zinc oxide, tantalum oxide, niobium oxide, lanthanum oxide, strontium oxide, yttrium oxide, hafnium oxide, tin oxide, antimony oxide, and combinations thereof.

4. The LED light source of claim 3, the mixed metal oxide nanoparticles comprising silicon oxide and zirconium oxide.

5. The LED light source of claim 3, the mixed metal oxide nanoparticles comprising silicon oxide and titanium oxide.

6. The LED light source of claim 3, the mixed metal oxide nanoparticles comprising silicon oxide, zirconium oxide, and titanium oxide.

7. The LED light source of claim 1, the surface-modified metal oxide nanoparticles comprising crystalline zirconium oxide nanoparticles having a refractive index of greater than about 1.8.

8. The LED light source of claim 1, the surface-modified metal oxide nanoparticles comprising crystalline titanium oxide nanoparticles having a refractive index of greater than about 2.0.

9. The LED light source of claim 1, the surface-modified metal oxide nanoparticles being surface-modified with a surface-modifier, the surface-modifier comprising hydrophilic groups.

10. The LED light source of claim 1, the surface-modified metal oxide nanoparticles being surface-modified with a surface-modifier, the surface-modifier comprising a carboxylic acid, a phosphonic acid, an alkoxysilane, or a combination or mixture thereof.

11. The LED light source of claim 10, the alkoxysilane comprising a polyethyleneglycol alkoxysilane.

12. The LED light source of claim 1, the bonding layer comprising from about 40 to about 95% by weight of the surface-modified metal oxide nanoparticles.

13. The LED light source of claim 1, the LED die comprising a light emitting layer having a refractive index of greater than 1.9, and the bonding layer having a thickness of from about 50 nm to about 100 microns.

14. The LED light source of claim 1, the LED die comprising a light emitting layer having a refractive index of less than or equal to 1.9, and the bonding layer having a thickness of from greater than about 5 nm to about 300 nm.

15. The LED light source of claim 1, wherein the LED die comprises a light emitting surface, the optical element comprises a light input surface, and the bonding layer bonds the light emitting surface and the light input surface together.

16. The LED light source of claim 1, the optical element having a refractive index of at least about 2.0.

17. The LED light source of claim 1, the optical element comprising a diverging or converging extractor.

18. A method of making an LED light source, the method comprising:
   a) providing an LED die;
   b) providing an optical element;
   c) providing a optical bonding composition comprising surface-modified metal oxide nanoparticles and a source of silicon in an aqueous solution having a pH greater than about 8, the source of silicon selected from the group consisting of silicate, silane, silicic acid, polymeric forms of silicic acid, alkoxysilane, and combinations thereof; and
   d) bonding the LED die and the optical element together by contacting the LED die and the optical element with the optical bonding composition.

19. The method of claim 18, wherein contacting the LED die and the optical element with the optical bonding composition is carried out at room temperature.

20. The method of claim 18, wherein an assembly is formed from bonding the LED die and the optical element together, and the method further comprises heating the assembly.

* * * * *